United States Patent [19]

Lux et al.

[11] 4,003,757

[45] Jan. 18, 1977

[54] SILVER-II-OXIDE FOR GALVANIC ELEMENTS

[75] Inventors: Walter Karl Lux, Horn, Austria; Tsvetko Chobanov, Frankfurt am Main, Germany

[73] Assignee: Varta Batterie Aktiengesellschaft, Hannover, Germany

[22] Filed: June 23, 1975

[21] Appl. No.: 589,562

[30] Foreign Application Priority Data

June 27, 1974 Germany .......................... 2430910

[52] U.S. Cl. .............................. 429/219; 423/42; 423/604

[51] Int. Cl.$^2$ .......................................... H01M 6/00

[58] Field of Search .............. 423/604, 35, 42; 136/20, 137, 75, 120 R

[56] References Cited

UNITED STATES PATENTS

| | | | |
|---|---|---|---|
| 2,528,891 | 11/1950 | Lawson | 423/604 X |
| 2,670,273 | 2/1954 | Munn | 423/604 X |
| 2,758,014 | 8/1956 | Drapeau et al. | 423/604 |

Primary Examiner—John H. Mack
Assistant Examiner—C. F. Lefevour
Attorney, Agent, or Firm—Weiser, Stapler & Spivak

[57] ABSTRACT

Silver-II-oxide for use in galvanic elements is produced by adding an oxidant to a metallic silver powder suspension in an alkaline solution.

An exceptionally stable material results.

12 Claims, No Drawings

SILVER-II-OXIDE FOR GALVANIC ELEMENTS

This invention relates to a process for producing silver-II-oxide for galvanic elements, and particularly for silver-II-oxide zinc primary elements.

In order that such silver-II-oxide zinc primary elements shall have long life, as is desirable if they are to be used to power watches, the silver-II-oxide must have high thermodynamic stability in order to achieve long shelf life.

The thermodynamic decomposition of silver-II-oxide in alkaline solution takes place in accordance with the equation $$2 \, AgO \rightarrow Ag_2O + \tfrac{1}{2} O_2$$

It is customary to produce silver-II-oxide destined for use in such primary elements by anodic oxidation of silver salts in a alkaline medium, or by electrolysis of a silver nitrate solution followed by washing and cooking, or by the action of ozone upon silver powder. Production by ozone treatment is comparatively costly, demanding of resources, and time consuming. Moreover, by use of these know processes one normally obtains products which exhibit high internal discharge. This is believed to be attributable to inadequate electrochemical stability of the silver powder. This high internal discharge rate is particularly undesirable for watch batteries since it causes the hermetically sealed cell to become distended.

Accordingly, it is a primary object of the invention to produce a silver-II-oxide having comparatively low internal discharge.

It is another object to produce a silver-II-oxide having a comparatively low decomposition rate.

It is another object to produce a silver-II-oxide cell having extended shelf life.

It is another object to provide a monoclinic crystalline silver-II-oxide.

It is another object to provide an improved electrode mass capable of sustaining high load currents.

This and other objects which will appear are achieved in accordance with the invention by treating metallic silver powder in an alkaline solution with an oxidant, thereby oxidizing it to silver-II-oxide. Preferably, potassium peroxidisulfate is used as the oxidant and the treatment takes place in caustic soda solution. The foregoing oxidizing agent is particularly characterized by a high resulting level of oxidation and by convenience of usage.

To practice the process of the invention, silver powder is suspending in an alkaline medium, such as an aqueous NaOH solution or KOH solution. The solution is heated to speed up the reaction, for example to the range of about 50° to 95° C. After reaching a predetermined temperature, the oxidant is added, preferably in incremental portions, the total quantity being such that it provides at least complete transformation of the silver powder to silver-II-oxide. Preferably an excess of oxidant is used. Up to twice the minimum quantity of oxidant necessary to achieve complete transformation may be utilized. As an example, 28 grams of the above mentioned oxidant would be the minimum quantity for the transformation of 10 grams of silver powder.

EXAMPLE

In 1.5 liters of aqueous solution containing 150 grams of sodium hydroxide, 65 grams of silver powder are suspended with continuous stirring. The silver powder has a density of approximately 1.6 grams per cubic centimeter. Its grain size distribution is: 52% under 10 microns; 33% 10 microns to 30 microns, 15% above 30 microns.

The liquid is then heated to about 85° C. Upon reaching this temperature, a total of 200 grams of potassium peroxidisulfate ($K_2S_2O_8$) in portions of about 40 grams each is added at intervals of, for example, 1 hour. After addition of the final portion of oxidant, stirring is continued for 3 hours. The product is then filtered, washed to free it of alkali substances, dried at a temperature of approximately 80° C and reduced to particle form.

The foregoing yields approximately 73 grams of silver-II-oxide with more than 95% content of pure silver-II-oxide. The silver oxide produced is characterized by high thermodynamic stability, low internal discharge and consequent long shelf life. The rate of gas evolution of there products in 18% NaOH is below 1 microliter per gram-hour at room temperature. This stability is attributable to the fact that the process embodying the invention produces single crystals of exceptionally regular shape and monoclinic form.

While not wishing to be bound by this, it is believed that the monoclinic crystalline structure is particularly advantageous for use in an electrode mass because it is capable of bearing high current loads. Large surface area and low internal resistance are conducive to this.

Instead of step-by-step addition of the oxidant as described in the specific example above, it is also possible to use continuous addition, as for example by drop-by-drop introduction.

The oxidant, of which a specific example is provided above, must be active in alkaline media, inasmuch as the AgO is a basic oxide. Only those oxidants are suitable which have a higher reduction potential than the $Ag_2O/AgO$ system.

A particular advantage of the invention, as compared with conventional processes, such as those using ozone to oxidize AgO, is the low cost of the technique.

We claim:

1. In a process for producing silver II-oxide for galvanic elements, the improvement which comprises
   adding an oxidant to an alkaline solution containing undissolved metallic silver powder, thereby oxidizing the powder to silver-II-oxide, the oxidant being potassium peroxidisulfate.

2. The process of claim 1 further comprising forming a suspension of the powder in the solution before the oxidant is added.

3. The process of claim 1 wherein the solution is an aqueous solution of sodium hydroxide.

4. The process of claim 1 further comprising heating the solution to approximately 50° to 95° C during the addition of oxidant.

5. The process of claim 1 wherein the solution is heated to a temperature of about 85° C during the addition of oxidant.

6. The process of claim 1 wherein the oxidant is added in incremental portions.

7. The process of claim 1 wherein a quantity of oxidant is added in excess of that sufficient to oxidize all the silver powder.

8. The process of claim 1 further comprising filtering the solids from the solution, washing them to remove alkaline substances, and drying them.

9. The process of claim 7 wherein up to two times the quantity necessary to oxidize all the silver powder is added.

10. The process of claim 8 further comprising reducing the dried material to particle form.

11. The process of claim 10 further comprising incorporating the material reduced to particle form into a galvanic element.

12. A material for use in primary cells produced by the steps of
forming a suspension of metallic silver powder in an alkaline solution, and
adding an oxidant to the solution to oxidize the powder into silver-II-oxide, the oxidant being potassium peroxidisulfate.

* * * * *